(12) United States Patent
Holonyak, Jr. et al.

(10) Patent No.: US 7,199,391 B2
(45) Date of Patent: Apr. 3, 2007

(54) DEVICE WITH QUANTUM DOT LAYER SPACED FROM DELTA DOPED LAYER

(75) Inventors: Nick Holonyak, Jr., Urbana, IL (US); Russell Dupuis, Austin, TX (US)

(73) Assignees: The Board of Trustees of the University of Illinois, Urbana, IL (US); The Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 10/843,894

(22) Filed: May 12, 2004

(65) Prior Publication Data

US 2004/0209416 A1    Oct. 21, 2004

Related U.S. Application Data

(60) Division of application No. 10/330,692, filed on Dec. 27, 2002, now Pat. No. 6,773,949, which is a continuation-in-part of application No. 10/209,279, filed on Jul. 31, 2002, now Pat. No. 6,753,273.

(60) Provisional application No. 60/309,149, filed on Jul. 31, 2001.

(51) Int. Cl.
    *H01L 31/0336* (2006.01)
(52) U.S. Cl. .............. 257/23; 257/14; 257/24; 257/25; 438/590
(58) Field of Classification Search .......... 257/14, 257/23, 24, 25; 438/590
    See application file for complete search history.

(56) References Cited

U.S. PATENT DOCUMENTS

| | | | |
|---|---|---|---|
| 4,575,924 A | 3/1986 | Reed et al. ............ 29/576 |
| 5,198,879 A | 3/1993 | Ohshima ............... 257/20 |
| 5,202,290 A * | 4/1993 | Moskovits .............. 438/478 |
| 5,509,024 A | 4/1996 | Bour et al. ............. 372/45 |
| 5,657,189 A | 8/1997 | Sandhu ............... 360/112 |
| 5,714,766 A | 2/1998 | Chen et al. ............ 257/17 |
| 5,909,614 A | 6/1999 | Krivoshlykov .......... 438/29 |
| 5,936,258 A | 8/1999 | Imamura et al. ........ 257/21 |
| 5,936,266 A | 8/1999 | Holonyak, Jr. et al. ... 257/106 |
| 6,346,431 B1 | 2/2002 | Yoo et al. ............. 438/94 |
| 6,369,403 B1 | 4/2002 | Holonyak .............. 257/13 |
| 6,407,439 B1 | 6/2002 | Hier et al. ............ 257/440 |
| 6,445,000 B1 | 9/2002 | Masalkar et al. ....... 257/21 |
| 6,455,870 B1 | 9/2002 | Wang et al. ........... 257/12 |
| 6,541,788 B2 | 4/2003 | Petroff et al. ......... 257/21 |
| 6,645,885 B2 | 11/2003 | Chua et al. ........... 257/10 |

FOREIGN PATENT DOCUMENTS

GB    2341722    3/2000

OTHER PUBLICATIONS

Thean et al. (IDS Reference) "Three-Dimensional Self-Consistent Simulation of Interface and Dopant Disorders in Delta-Doped Grid Quantum Dot Devices", J. Appl. Phys. 82(4), Aug. 15, 1997.*

(Continued)

*Primary Examiner*—Nathan J. Flynn
*Assistant Examiner*—Scott R Wilson
(74) *Attorney, Agent, or Firm*—Martin Novack

(57) ABSTRACT

A method of forming a semiconductor device includes the following steps: providing a plurality of semiconductor layers; providing means for coupling signals to and/or from layers of the device; providing a layer of quantum dots disposed between adjacent layers of the device; and providing an auxiliary layer disposed in one of the adjacent layers, and spaced from the layer of quantum dots, the auxiliary layer being operative to communicate carriers with the layer of quantum dots.

18 Claims, 16 Drawing Sheets

OTHER PUBLICATIONS

L. V. Asryan and S. Luryi, "Tunneling-Injection Quantum-Dot Laser: Ultrahigh Temperature Stability", IEEE Journal of Quantum Electronics, vol. 37, pp. 905-910 (Jul. 2001).

A. F. Tsatsul'nikor, A. Yu. Egorov, A.E. Zhukov, A.R. Kovsh, V.M. Ustinov, N.N. Ledentsov, M.V. Maksimov, A.V. Sakharow, A.A. Suvorova, P.S. Kop'ev, and Zh. I. Alferov "Modulation of a Quantum Well Potential by a Quantum Dot Array", Semiconductors 31, 88-91 (1997).

M.V. Maximov, L.V. Asryan, Yu.M. Shernyakov, A.F. Tsatsul'nikov, I.N. Kaiander, V.V. Nikolaev, A.R. Kovsh, S.S. Mikhrin, V.M. Ustinov, A.E. Zhukov, Zh.I. Alferov, N.N. Ledenstov, and D. Bimberg, "Gain and Threshold Characteristics of Long Wavelength Lasers Based on InAs/GaAS Quantum dots Formed by Activated Alloy Phase Separation", IEEE Journal of Quamtum Electronics, vol. 37, No. 5, May. 2001.

E.A. Rezek, N. Holonyak, Jr., B.A. Vojak, G.E. Stillman, J.A. Rossi, D.L. Keune, and J.D. Fairing, "LPE $In_{1-x}Ga_xP_{1-z}As_z$ (x ~ 0.12,z ~ 0.26) DH Laser With Multiple Thin-Layer (< 500 Å) Active Region", Appl. Phys. Lett., vol. 31, pp. 288-290, Aug. 15, 1977.

G.T. Liu. A. Stintz, H.Li, K.J. Malloy and L.F. Lester, "Extremely Low Room Temperature Threshold Current Density Diode Lasers Using InAs Dots in $In_{0.15}Ga_{0.85}As$ Quantum Well", Electronics Letters, vol. 35 No. 14 Jul. 8, 1999.

U.S. Appl. No. 03/059,998, filed Mar. 2003, Holonyak et al.

G.T. Liu, A. Stintz, H. Li, T.C. Newell, A.L. Gray, P.M. Varangis, K.J. Malloy, and L.F. Lester, "The Influence Of Quantum-Well Composition On The Performance Of Quantum Dot Lasers Using InAs/InGaAs Dots-In-A-Well (DWELL) Structures", IEEE Journal Of Quantum Electronics, vol. 36, No. 11, Nov. 2000.

A. Stintz, G.T. Liu, Student member, IEEE, H.Li, L.F. Lester, Member, IEEE, and K.J. Malloy, Member IEEE, "Low-Threshold Current Density 1.3 μm InAs Quantum-Dot Lasers With The Dots-In-A-Well (DWELL) Structure", IEEE Photonics Technology Letters, vol. 12, No. 6, Jun. 2000.

J.H. Ryou, R.D. Dupuis, G. Walter, N. Holonyak, Jr., D.T. Mathes, R. Hull, C.V. Reddy and V. Narayanamurti, "Properties Of InP Self-Assembled Quantum Dots embedded In $In_{0.49}(Al_xGa_{1-x})_{0.51}P$ For Visible Light Emitting Laser Applications Grown By Metalorganic Chemical Vapor Deposition", Journal Of Applied Physics, vol. 91, No. 8, Apr. 15, 2002.

U.S. Appl. No. 02/079,485, filed Jun. 2002, Stintz et al.

P.G. Eliseev, H.Li, A. Stintz, G.T. Lui, T.C. Newell, K.J. Malloy, and L.F. Lester, "Transition Dipole Moment Of InAs/InGaAs Quantum Dots From Experiments On Ultralow-Threshold Laser Diodes", Applied Physics Letters, vol. 77, No. 2, Jul. 10, 2000.

G. Walter, N. Holonyak, Jr., R. Heller and R.D. Dupuis, "Visible Spectrum (654 mn) Room Temperature Continuous Wave (cw) InP Quantum Dot Coupled To InGaP Quantum Well InP-InGaP-In(AIGA) P-InAl1P Heterostructure Laser", Appl. Phys. Lett., vol. 81, No. 24, Dec. 9, 2002.

E.A. Rezek, H. Shichijo, B.A. Vojak, and N. Holonyak, Jr., "Confined-Carrier Luminescene of a Thin $In_{1-x}Ga_xP_{1-z}As_z$ Well (x ~ 0.13, z ~ 0.29; ~ 400 Å) in an InP p-n Junction," Appl. Phys. Lett., vol. 31 pp. 534-536, Oct. 15, 1977.

J.H. Ryou, R. Dupuis, N. Holonyak, et al. "Photopumped Red-Emitting $InP/In_{0.5}Al_{0.3}Ga_{0.2}P$ Self-Assembled Quantum Dot Heterostructure Lasers Grown By Metaloroganic Chemical Vapor Deposition", Appl. Phys. Lett. 78, 4091-4093, Jun. 25, 2001.

T. Richard, E. Chen, A. Sugg, G. Hofler, and N. Holonyak, "High Current Density Carbon-Doped Strained-Layer GaAs (p$^+$) -InGaAs (n$_+$) -GaAs (n$_+$) p-n Tunnel Diodes", Appl. Phys. Lett. 63, 3616 (Dec. 27, 1993).

H. Saito et al., "Room Temperature Lasing Operation Of A Quantum Dot Vertical Cavity Surface Emitting Laser", Appl. Phys. Lett. 69 (21), Nov. 18, 1996.

M. Maximov et al., "High Power Continuous Wave Operation InGaAs/AlGaAs Quantum Dot Laser", J. Appl. Phys., 83, 10, May 1998.

G. Walter, N. Holonyak, J. Ryou and R. Dupuis, "Room-Temperature Continuous Photopumped Laser Operation Of Coupled InP Quantum Dot And InGaP Quantum Well InP-In (AlGa) P-InAlP Heterostructures", Appl. Phys. Lett. 79, 1956 (Sep. 24, 2001).

G. Walter, H. Holonyak, J. Ryou and R. Dupuis, "Coupled InP Quantum Dot InGaP Quantum Well InP-In (AlGa) P-InAlP Heterostructure Diode Laser Operation", Appl. Phys. Lett. 79, 3215 (Nov. 2001).

G. Walter, T. Chung, and N. Holonyak, Jr., "High Gain Coupled InGaAs Quantum Well InAs Quantum Dot AlGaAs-GaAs-InGaAs-InAs Heterostructure Diode Laser Operation", Appl. Phys. Lett. 80, 1126 (Feb. 2002).

T. Chung, G. Walter, and N. Holonyak, Jr., "Coupled Strained-Layer InGaAs Quantum-Well Improvement Of An InAs Quantum Dot AlGaAs-GaAs-InAs Heterostructure Laser", Appl. Phys. Lett., 79, 4500 (Dec. 2001).

S. Chuang and N. Holonyak, "Efficient Quantum Well To Quantum Dot Tunneling: Analytical Solutions", Appl. Phys. Lett. 80, 1270 (Feb. 2002).

J.M. Dallesasse, N. Holonyak, Jr., A.R. Sugg, T.A. Richard, and N. El-Zein, Appl. Phys. Lett. 57, 2844 (1990).

Thean et al, "Three-dimensional Self-consistant Simulation of Interface and Dopant Disorders in Delta-doped Grid Quantum Dot Devices" J. Appl. Phy 82(4) ,Aug. 15, 1997.

S. Weber, W. Limmer, K. Thonke, R. Sauer, K. Panzlaff, G. Bacher, H. P. Meier, and P. Roentgen, Phys. Rev. B 52, 14739 (1995).

M. Gurioli, J. Martinez-Pastor, M. Colocci, C. Deparis, B. Chastaingt, and J. Massies, Phys. Rev. B 46, 6922 (1992).

W. J. Turner, W. E. Reese, and G. D. Pettit, Phys. Rev. 136, A1467 (1964).

X. B. Zhang, K. L. Ha, and S. K. Hark, J. Electron. Mater. 30, 1332 (2001).

L. Brusaferri, S. Sanguinetti, E. Grilli, M. Guzzi, A. Bignazzi, F. Bogani, L. Carraresi, M. Colocci, A. Bosacchi, P. Frigeri, and S. Franchi, Appl. Phys. Lett. 69, 3354, (1996).

E. F. Schubert "Delta-Doping Of Semiconductors" (book) , Cambridge . University Press.

Heller et al., "Low Threshold Room Temperature Continuous Wave InP Quantum Dot Coupled to InGaP Quantum Well Heterostructure Laser Grown by MOCVD" (2003 IEEE) , conference article.

Ranjan, "Shallow Impurities And Delta Doping In Quantum Dot And Quantum Well Systems", Journal of Condensed Matter, (13) (2001) 8105-8119.

* cited by examiner

| GaAs cap $t$=5nm |
|---|
| InAlP upper cladding layer $t$=0.4μm |
| InAlGaP ($x$=0.4) outer waveguide $t$=0.1μm |
| InAlGaP ($x$=0.2) inner waveguide $t$=54nm |
| InP QD layer 1 ($t$=15ML) |
| InAlGaP ($x$=0.2) inner waveguide $t$=54nm |
| InAlGaP ($x$=0.4) waveguide $t$=0.1μm |
| InAlP lower cladding layer $t$=0.4μm |
| GaAs buffer |
| GaAs (100) |

$\lambda/2$ cavity for $\lambda$=650nm (bracketing the four inner layers)

FIG. 5A

| GaAs cap $t$=5nm |
|---|
| InAlP upper cladding layer $t$=0.4μm |
| InAlGaP ($x$=0.3) waveguide $t$=54nm |
| InP QD layer 1 ($t$=15ML) |
| InAlGaP ($x$=0.3) waveguide $t$=54nm |
| InAlP lower cladding layer $t$=0.4μm |
| GaAs buffer |
| GaAs (100) on axis; 10°--<110> |

$\lambda/2$ cavity for $\lambda$=650nm (bracketing the three middle layers)

FIG. 5B

| GaAs cap $t=5$nm |
|---|
| InAlP upper cladding layer $t=0.4\mu$m |
| InAlGaP ($x=0.3$) inner waveguide $t=50$nm |
| InP QD layer 4 ($t=15$ML) |
| InAlGaP ($x=0.3$) barrier $t=5$-$10$nm |
| InP QD layer 3 ($t=15$ML) |
| InAlGaP ($x=0.3$) barrier $t=5$-$10$nm |
| InP QD layer 2 ($t=15$ML) |
| InAlGaP ($x=0.3$) barrier $t=5$-$10$nm |
| InP QD layer 1 ($t=15$ML) |
| InAlGaP ($x=0.3$) inner waveguide $t=50$nm |
| InAlP lower cladding layer $t=0.4\mu$m |
| GaAs buffer |
| GaAs (100) |

$\lambda/2$ cavity for $\lambda=650$nm

FIG. 5C

| GaAs cap $t=5$nm |
|---|
| InAlP upper cladding layer $t=0.4\mu$m |
| InAlGaP ($x=0.3$) inner waveguide $t=50$nm |
| InP QD layer 3 ($t=15$ML) |
| InAlGaP ($x=0.3$) barrier $t=5$nm |
| InP QD layer 2 ($t=15$ML) |
| InAlGaP ($x=0.3$) barrier $t=5$nm |
| InP QD layer 1 ($t=15$ML) |
| InAlGaP ($x=0.3$) inner waveguide $t=50$nm |
| InAlP lower cladding layer $t=0.4\mu$m |
| GaAs buffer |
| GaAs (100) |

$\lambda/2$ cavity for $\lambda=650$nm

FIG. 5D

| GaAs cap t=5nm |
| InAlP upper cladding layer t=0.4μm |
| InAlGaP (x=0.3) inner waveguide t=50nm |
| InP QD layer 2 (t=15ML) |
| InAlGaP (x=0.3) barrier t=4nm |
| InGaP QW communication layer (t=2nm) |
| InAlGaP (x=0.3) inner waveguide t=50nm |
| InAlP lower cladding layer t=0.4μm |
| GaAs buffer |
| GaAs (100) |

λ/2 cavity for λ=650nm

FIG. 6A

| GaAs cap t=5nm |
| InAlP upper cladding layer t=0.4μm |
| InAlGaP (x=0.3) inner waveguide t=50nm |
| InP QD layer 2 (t=15ML) |
| InAlGaP (x=0.3) barrier t=4nm |
| InGaP QW communication layer (t=2nm) |
| InAlGaP (x=0.3) barrier t=4nm |
| InP QD layer 1 (t=15ML) |
| InAlGaP (x=0.3) inner waveguide t=50nm |
| InAlP lower cladding layer t=0.4μm |
| GaAs buffer |
| GaAs (100) |

λ/2 cavity for λ=650nm for λ=650nm

FIG. 6B

DEVICE WITH QUANTUM DOT LAYER SPACED FROM DELTA DOPED LAYER

RELATED APPLICATION

This is a divisional of U.S. application Ser. No. 10/330,692 filed Dec. 27, 2002 now U.S. Pat. No. 6,773,949, which is a continuation-in part of U.S. application Ser. No. 10/209,279 filed Jul. 31, 2002 now U.S. Pat. No. 6,753,273, which, in turn, claims priority from U.S. Provisional Application Ser. No. 60/309,149, filed Jul. 31, 2001. The said application Ser. No. 10/330,692 is hereby incorporated by reference.

This invention was made with Government support, and the Government has certain rights in this invention

FIELD OF THE INVENTION

This invention relates to the field of semiconductor devices and methods of making same, and, more particularly, to a semiconductor device having a layer of quantum dots and at least one other layer, spaced therefrom, which communicates carriers in either direction with the quantum dot layer, and to a method of making such a device.

BACKGROUND OF THE INVENTION

In 1977 there was introduced the quantum-well (QW) laser, a laser that in the active region employs one or more thin quantum well layers ($L_z$ less than about 400 Å) sandwiched in a thicker wavequide region that is further enclosed by still higher gap p-type and n-type confining layers (see E. A. Rezek, N. Holonyak, Jr., B. A. Vojak, G. E. Stillman, J. A. Rossi, D. L. Keune, and J. D. Fairing, "LPE $In_{1-x}Ga_xP_{1-z}As_z$ (x~0.12, z~0.26) DH Laser With Multiple Thin-Layer (<500 Å) Active Region," Appl. Phys. Lett., vol 31, pp 288–290, Aug. 15, 1977; E. A. Rezek, H. Shichijo, B. A. Vojak, and N. Holonyak, Jr., "Confined-Carrier Luminescence of a Thin $In_{1-x}Ga_xP_{1-z}As_z$ Well (x~0.13, z~0.29; ~400 Å) in an InP p-n Junction," Appl. Phys. Lett., vol. 31 pp. 534–536, Oct. 15, 1977). For about ten years, numerous groups have been trying to convert the quantum well laser, which is practical and widely manufactured, into a so-called quantum-dot laser. The goal has been to build an ultimate laser. In theory, the thin quantum well layer (or layers) of a QW laser is "cut-up" into (ideally) a uniform dense sheet of identical little quantum boxes (i.e., quantum dots). With such a structure, instead of the electrons and holes being injected (via current, light, etc.) and collected in an easily grown thin ($L_z$ less than about 400 Å) uniform QW sheet (thus with one dimensional thickness confinement and quantization; a 2-D structure), the electrons and holes are collected and recombine in the little quantum dots (i.e., quantum boxes; hence, three-dimensional confinement and quantization; a 0-D structure). The little boxes, or dots, are like "fat" little molecules and (ideally) all alike and densely and uniformly arranged. [Reference can be made, for example, to U.S. Pat. No. 6,369,403, and to J. H. Ryou, R. Dupuis, G. Walter, D. Kellog, N. Holonyak, Jr., D. Mathes, R. Hull, C. Reddy, and V. Narayanamurti, Appl. Phys. Lett. 78, 4091 (2001).] Actually, the quantum dots are stochastic and probabilistic, small but random. They are random in geometry, in size, and in arrangement - - - and not dense enough, i.e., are not in sufficient proximity to be quantum coupled (by tunneling). Electron-hole (e-h) pairs are stuck in each box (assuming they are collected at all) and don't transport to neighboring boxes. The e-h pairs don't move around and re-arrange in the plane of the dots as readily as they do in a thin QW sheet ($L_z$ less than about 400 Å; $L_x$, $L_y$ extended in the plane; hence a 2-D structure). In short, there is little or no conduction along the sheet (or sheets) of quantum dots.

It is among the objects of the present invention to provide devices, and methods of making same, which are responsive to the foregoing limitations of the prior art, and to also provide devices which exhibit improved operation as light emitters and as other applications.

SUMMARY OF THE INVENTION

A major problem with quantum dot heterostructures (QDHs) is the stochastic nature of QD structures, the lack of uniformity, insufficient QD density, and poor QD-to-QD coupling. In accordance with an aspect hereof, a solution to the problem is to couple, via a thin barrier, the sheet (or multiple sheets) of QDs to an auxiliary layer. In a form hereof, the auxiliary layer is a QW layer, e.g., the QW layer of a QW laser. The higher energy states of the QDs are resonant with and couple by tunneling to the lower confined-particle states of the thin uniform QW layer. Electron-hole transport in the QW layer can re-arrange the e-h pairs in the plane and provide the dot-to-dot coupling. That is, an electron tunnels from the QD to the QW layer, transports in the plane in the QW layer, and re-tunnels back into another QD. Hence, one can couple the QDs - - - not in the plane, but out of the plane into a QW layer, then at some other point in the plane of the QW layer back into another QD. In this manner, the invention makes it possible for the charge to get unstuck from a QD and move from dot to dot in the waveguide region to help optimize emission.

Also, should the QDs not collect injected electron-hole pairs efficiently (a distinct possibility), the thin auxiliary QW layer (or, if necessary or desirable, multiple QW layers) will collect the injected carriers and feed them via resonant tunneling into the quantum dots to then scatter the carriers down to the lower energy dot states for recombination (for photon generation and laser operation). It is clear that multiple QD layers and multiple QW auxiliary or connection (communication) layers can be employed and can be part of laser or other device designs.

In another form hereof, the auxiliary layer is a delta doped layer. [As known in the art, a delta doped layer is an extremely thin (up to several atomic layers) layer highly populated with dopant (at least about $10^{18}/cm^8$).] As seen hereinbelow, the performance of a quantum dot device exhibits great improvement when delta doped auxiliary layers are introduced in the layers adjacent the quantum dots.

In accordance with a further aspect hereof, the quantum dots, since they are a lower gap component of the III–V QD heterostructure, can be doped or be left undoped. In other words, the QD can be modified into a quantum "doping ball." There may be advantages in employing n-type or p-type QD "doping balls", just as there may be device-design reasons to leave the QW auxiliary connection or communication layer undoped, or doped n-type or doped p-type. The QW auxiliary connection layer can be close coupled to the QDs (small separating barrier thickness) or can be weakly coupled (large barrier thickness). Also, the QW auxiliary layer can be thicker and drop its lower confined-particle states below the lowest QD states, or can be made thinner and raise its lowest confined-particle states above the lowest QD states. The foregoing types of techniques and structures can be incorporated into field effect transistor devices. For example, doped QDs, i.e., "doping balls," can be used to modify the so-called pseudomorphic transistor into a new form of field effect transistor. The doped QDs can be employed with or without auxiliary QW layer(s).

After GaAs ($E_g$=1.42 eV) it becomes almost impossible to make a higher gap, say GaP ($E_g$=2.26 eV), tunnel diode. Higher gaps (higher energies) require narrower tunneling distances, which in a p-n tunnel diode requires higher doping, not, as is common, the lower impurity solubility that comes with higher gap.

A tunnel diode can be devised that is not one large uniform junction, but rather an array of microscopic tunnel junctions, for instance an array of doped quantum dots on the n side of a p-n junction. For example, the GaAs($p^+$)–InGaAs($n^+$)–GaAs($n^+$)p-n tunnel diode made in 1993 (Richard, et al., Appl. Phys. Lett. 63, 3616 (27 Dec. 1993), i.e., the narrow gap InGaAs center region, a reduced barrier, can be "cut up" into quantum dots. The significance of this kind of structure for tunnel contacts on VCSEL lasers, etc., can be understood in conjunction with U.S. Pat. No. 6,369,403.

Similar doped QDs, of a type that are employed in a tunnel contact or a tunnel diode, are the same type of doped QDs, or doping balls (DBs) that can be used as doping sources in any layered heterostructure, including in all the various kinds of quantum dot (QD) light emitting devices (e.g. lasers) that are described in numerous articles in the journal literature. Doping dots (DDs), or doping balls (DBs), can be laced through high gap material (in layers) to act as the source of carriers. The little QD doping ball, being small enough, can be incorporated into the higher gap material even if lattice mismatched and not create defects (dislocations). The doping ball, and its "squeezed" higher energy states, carries impurity at the solubility limits of the QD material, for example, an InP QD in higher gap $In_{0.5}Ga_{0.5}P$ or in $In_{0.5}Al_{0.3}Ga_{0.2}P$, and not at the solubility limits of the higher gap layer (the matrix) into which the QDs are incorporated.

The layers or regions of doping QDs (DDs or DBs) are versatile layers (n-type, p-type, or undoped) that can be incorporated into heterostructure devices, just as quantum wells, barriers, coupling barriers, waveguide regions, confining layers, etc. are incorporated into devices. Various kinds of devices, light emitters (LEDs and lasers), detectors, transistors, etc., can benefit. The QDs needn't be viewed as just little "boxes" for carrier recombination (as in today's QD lasers), i.e., a "center" for improved carrier recombination, but, more broadly, the QD can be viewed as a special little "box" that can carry impurity into a region that otherwise is difficult to dope, or that offers an opportunity for enhanced doping. All the III–V materials are candidates for QD layering and doping dot techniques and devices. The nitride materials are relatively high gap and relatively hard to dope, and would therefore particularly benefit from employment of doping dots.

In accordance with the invention, a method is set forth of forming a semiconductor device, comprising the following steps: providing a plurality of semiconductor layers; providing a means for coupling signals to and/or from layers of the device (for example, providing conductive layers and/or electrodes to which signals can be applied, or providing a suitable optical technique for excitation+, etc.); providing a layer of quantum dots disposed between adjacent layers of the device; and providing an auxiliary layer disposed in one of the adjacent layers, and spaced from the layer of quantum dots, the auxiliary layer being operative to communicate carriers with said layer of quantum dots. In one embodiment, the auxiliary layer comprises a quantum well, and in another embodiment the auxiliary layer comprises a delta doped layer. The delta doped layer is preferably doped to a concentration of at least about $N=10^{18}/cm^3$.

In accordance with a form of the invention, there is set forth a method of forming a semiconductor device, including the steps of: providing a plurality of semiconductor layers; providing a means for coupling signals to and/or from layers of the device; providing a quantum well disposed between adjacent layers of the device; and providing a layer of quantum dots disposed in one of the adjacent layers, and spaced from the quantum well, whereby carriers can tunnel in either direction between the quantum well and the quantum dots. In an embodiment of this form of the invention the quantum dot layer is spaced from said quantum well layer by a barrier layer and the barrier layer has a thickness in the range about 5 Angstroms to 100 Angstroms. In this embodiment, the step of providing a layer of quantum dots comprises providing doped quantum dots. Also in this embodiment, the step of providing doped dots comprises providing dots doped to a concentration of at least $N=10^{15}/cm^3$ for n-type doping, and providing dots doped to a concentration of at least $N=10^{16}/cm^3$ for p-type doping. Further in this embodiment, the step of providing dots comprises providing dots having an average size in the range 10 to 100 Angstroms height and 10 to 200 Angstroms diameter, and having an average density in the range $10^{10}$ to $10^{12}$ per $cm^2$.

In accordance with a further form of the invention, there is provided a semiconductor device which comprises: a plurality of semiconductor layers; means for coupling signals to and/or from layers of the device; a quantum well disposed between adjacent layers of the device; and a layer of quantum dots disposed in one of the adjacent layers, and spaced from the quantum well, whereby carriers can tunnel in either direction between the quantum well and the quantum dots.

In accordance with another form of the invention, there is provided a semiconductor device which comprises: a plurality of III–V semiconductor layers; means for coupling signals to and/or from layers of the device; and a layer of doped quantum dots disposed in at least one of the layers as a source of carriers that can communicate in either direction between the dots and another layer.

Further features and advantages of the invention will become more readily apparent from the following detailed description when taken in conjunction with the accompanying drawings.

BRIEF DESCRIPTION OF THE DRAWINGS

FIG. 5 show samples of III–V heterostructures having quantum dot layers (without coupled quantum well), from which test devices were made.

FIGS. 6 and 7 show samples of III–V heterostructures having coupled quantum well and quantum dot layers, from which test devices were made.

DETAILED DESCRIPTION

Figure 1:
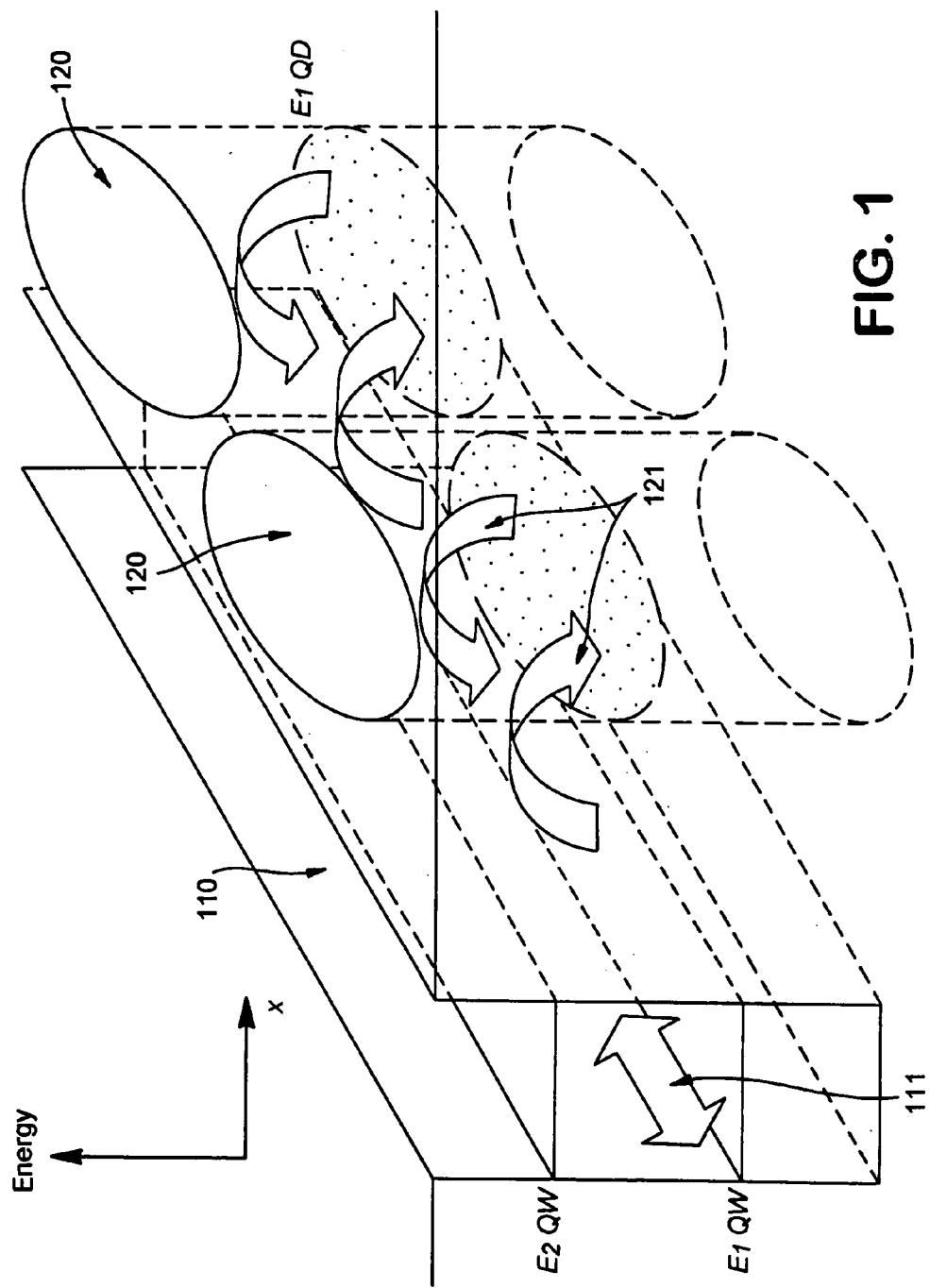
FIG. 1 is a diagram, in accordance with a form of the invention, illustrating intra-QW carrier transport, and inter-QD-QW transport (in both directions) by tunnelling of carriers in a device with a quantum dot layer disposed in close proximity to a quantum well layer.

FIG. 1 is a diagram illustrating intra-QW carrier transport, and inter-QD-QW transport (in both directions) by tunnelling of carriers in a device with a quantum dot layer disposed in close proximity to a quantum well layer. In FIG. 1, the vertical direction represents energy level, and the x direction is normal to the plane of the device layers. The quantum well communication layer is represented at 110, and quantum dots are represented at 120. Quantum well energy states are labelled at E$_1$QW and E$_2$QW, and quantum dot energy state is labelled at E$_1$QD. Double-headed arrow III represents intra QW transport, and the arrows 121 represent inter QW-QD transport in both directions. As seen from the diagram, an electron can, for example, tunnel from quantum dot to the quantum well layer, transports in the quantum well layer, and re-tunnels back into another quantum dot. In this manner, it is possible for the charge to get unstuck from a quantum dot and move from dot to dot in the waveguide region of the dot, for example, to enhance recombination radiation emission.

Figure 2:
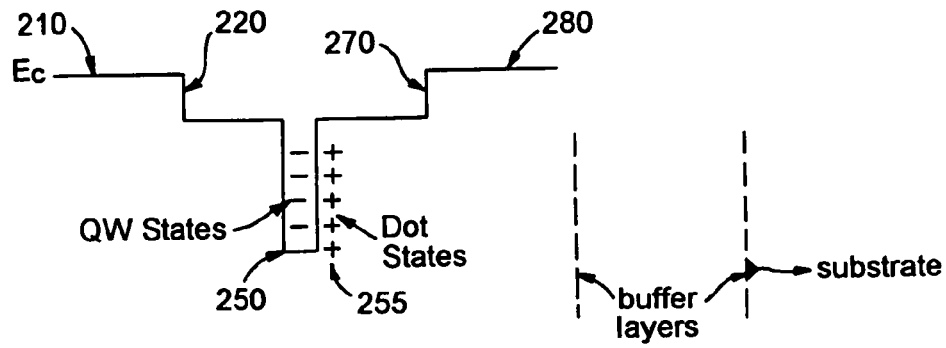
FIGS. 2 and 3 are energy diagrams for two respective III–V quantum well heterostructure light emitting devices having quantum dots in close proximity to and coupled with the quantum well.
Figure 3:
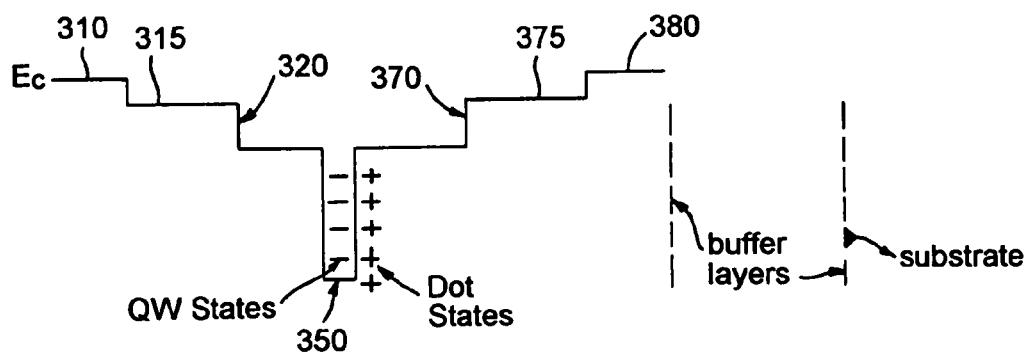

FIGS. 2 and 3 are energy diagrams for two respective III–V quantum well heterostructure light emitting devices having quantum dots in close proximity to and coupled with the quantum well.

The FIG. 2 device has InAlP confining layers of respective p and n type (210, 280), In(AlGa)P guiding layers (220, 270) defining the waveguide region, an InGaP quantum well (250), the QW states being shown, and an InP quantum dot layer (255), the QD states also being shown.

The FIG. 3 device has Al$_y$Ga$_{1-y}$As and Al$_x$Ga$_{1-x}$As cladding layers of respective p and n type (310, 315 and 380, 375), GaAs guiding layers (320, 370) defining the waveguide region, an InGaAs quantum well (350), the QW states being shown, and an InGaAs quantum dot layer (355), the QD states also being shown.

Figure 4:
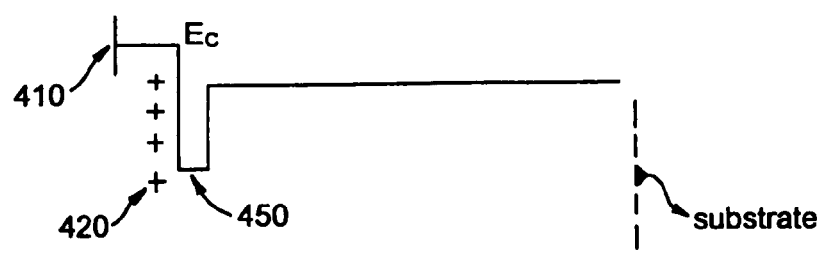
FIG. 4 is an energy diagram for a III–V pseudomorphic field effect transducer device employing doping dots.

FIG. 4 is an energy diagram for a III–V pseudomorphic field effect transducer device employing doping dots. The FIG. 4 device has a crystal surface 410, for example InGaP or AlGaAs, on which the metal gate electrode is deposited. InAs doping dots 420, in a thin barrier of InGaP or AlGaAs are closely spaced from an InGaAs quantum well 450 (together comprising the channel) on GaAs.

FIG. 5 show samples of III–V heterostructures having quantum dot layers (without coupled quantum well), from which test devices were made. FIGS. 5A, 5B, 5C, and 5D show the layer structure of three samples used for testing to show a baseline for conventional quantum dot devices. The samples of FIGS. 5A and 5B have a single quantum dot layer, and the sample of FIG. 5c has multiple quantum dot layers. In these and the subsequent samples, the In(AlGa)P layers are In$_{0.5}$(Al$_x$Ga$_{1-x}$)l$_{0.5}$P.

Figure 7:

FIGS. 6 and 7 show samples of III–V heterostructures having coupled quantum well and quantum dot layers, from which test devices were made. In FIG. 6A, the sample has a single quantum dot layer and a single quantum well communication layer. The FIG. 6B sample has plural quantum dot layers and quantum well communication layer therebetween. The FIG. 7 sample has multiple quantum dot layers with quantum well communication layers therebetween.

Figure 8:
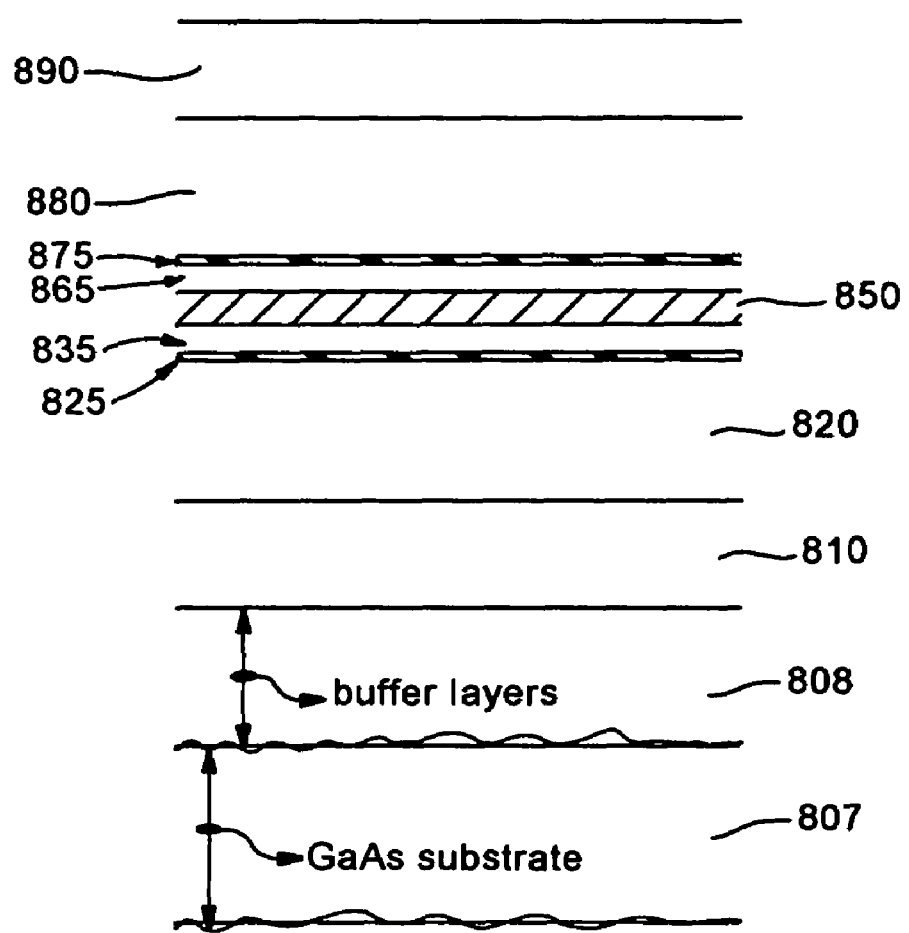
FIG. 8 is a diagram of a III–V coupled QD-QW heterostructure laser in accordance with an embodiment of the invention.

FIG. 8 is a diagram of a III–V coupled QD-QW heterostructure laser. The structure shown is similar to that of the sample of FIG. 6B, with a single InGaP communicating quantum well between layers of InP quantum dots. In the diagram of FIG. 8, the layers 810 and 890 are, respectively, n-type and p-type In$_{0.5}$Al$_{0.5}$P lower and upper cladding layers. The layers 820 and 880 are, respectively, In$_{0.5}$((Al$_x$Ga$_{1-x}$)$_{0.5}$P lower and upper waveguide layers. The InP quantum dot layers are represented at 825 and 875, and are separated from the In$_{0.5}$Ga$_{0.5}$P quantum well communication layer by thin barriers 835 and 865 of In$_{0.5}$(Al$_x$Ga$_{1-x}$)$_{0.5}$P. GaAs substrate and buffer layers are shown at 807 and 808, and a GaAs cap layer can be deposited on the layer 890. Suitable metallization can also be applied. In this embodiment, the quantum well thickness is in the range 20 to 100 Angstroms, the barriers are in the range 5 to 15 mono-layers. The waveguide thickness is about 1000 Angstroms.

In G. Walter, N. Holonyak, Jr., J. Ryou and R. Dupuis, Appl. Phys. Lett. 79, 1956 (September 2001) we present data demonstrating continuous 300 K photopumped InP quantum dot laser operation (656–679 nm) of an InP—In(AlGa)P—InAlP heterostructure, in accordance with the principles hereof, grown by metalorganic chemical vapor deposition.

In G. Walter, N. Holonyak, Jr., J. Ryou and R. Dupuis, Appl. Phys. Lett. 79, 3215 (November 2001) we present data showing that a p-n InP—In$_{0.5}$Ga$_{0.5}$P—In$_{0.5}$(Al$_{0.3}$Ga$_{0.2}$)P—In$_{0.5}$Al$_{0.5}$P quantum dot (QD) heterostructure diode, with an auxiliary ~20 A InGaP quantum well coupled via an In(AlGa)P barrier (~20 A) to the single layer of QDs to aid carrier collection, in accordance with the principles hereof, has a steeper current-voltage characteristic than the case of a similar diode with no auxiliary QW.

In G. Walter, T. Chung, and N. Holonyak, Jr. Appl. Phys. Lett. 80, 1126 (February 2002), data are given showing that a single-layer InAs quantum dot (QD) laser in the AlGaAs—GaAs—InGaAs—InAs heterostsructure system is improved in gain and continuous wave (cw) room temperature operation by coupling, via tunneling, auxiliary strained-layer InGaAs quantum wells to the single InAs QD layer, in accordance with the principles hereof, to assist carrier collection and thermalization. A QW-assisted single-layer InAs QD+QW laser was demonstrated that operated cw (300 K), and a diode length 150 µm in pulsed operation, exhibiting gain as high as ~100 cm$^{-1}$.

Regarding formation of the quantum dot layer(s), reference can be made to T. Chung, G. Walter, and N. Holonyak, Jr. Appl. Phys. Lett., 79, 4500 (December 2001), wherein data are presented showing that, besides the improvement in carrier collection, it is advantageous to locate strain-matching auxiliary InGaAs layers (quantum wells) within tunneling distance of a single-quantum-dot (QD) layer of an AlGaAs—GaAs—InGaAs—InAs QD heterostructure laser to realize also smaller size QDs of greater density and uniformity.

A theoretical analysis of a QD plus QW device, in accordance with the principles hereof, is described in S. Chuang and N. Holonyak, Jr., Appl. Phys. Lett. 80, 1270 (February 2002). Calculations showed that the added requirement of tunneling in the device does not impede the population of the dot states.

In a further embodiment hereof, the gain and performance of a device is improved by coupling, via resonance tunneling, the ground state of an unstrained 70 Å InGaP QW (~654 nm peak) to the collective (stochastic) first excited state of the 7.5 ML (monolayer) InP QDs (~654 nm). High efficiency 300 K cw laser operation at ~654 nm is realized for the coupled InP QD+InGaP QW p-n InP—InGaP—In(AlGa)P—InAlP heterostructure.

The InP QD+InGaP QW heterostructure is grown by metalorganic chemical vapor deposition (MOCVD). The growth of the AlGaAs/InAlP cladding/InAlGaP guiding layer and barrier/InGaP quantum well/InP quantum dot heterostructure is accomplished on Si-doped GaAs (100) on-axis substrates by low-pressure MOCVD in a modified EMCORE GS3200-UTM reactor at a pressure of 60 Torr and a growth temperature of 650° C. Adduct purified trimethylindium, triethylgallium, and trimethylaluminum are used for the Column III sources, and high-purity 100% arsine and phosphine for the Group V sources with purified $H_2$ as the carrier gas. The dopant sources are disilane (n-type) and bis(cyclopentadienyl)magnesium (p-type). The growth of the epitaxial layers consists first of an n-type (Si) highly doped GaAs buffer layer, followed by an n-type (Si) $In_{0.5}Al_{0.5}P$ lower cladding layer (600 nm), and next the undoped waveguide and active region consisting of two $In_{0.5}Al_{0.3}Ga_{0.2}P$ guiding layers (120 nm) on each side of the $In_{0.5}Ga_{0.5}P$ QW (7 nm) coupled to the InP QDs (7.5 ML) by a thin $In_{0.5}Al_{0.3}Ga_{0.2}P$ barrier (2 nm). The structure then has on top a p-type (Mg-doped) $In_{0.5}Al_{0.5}P$ cladding layer (600 nm), a p-type (Mg) $Al_{0.85}Ga_{0.15}As$ layer (200 nm) for stripe-geometry oxidation, and a p-type (Mg) GaAs contact layer (100 nm).

For the QD+QW laser diode, fabrication is performed by first patterning 12 μm protective $SiN_4$ stripes on the crystal. The p-type $Al_{0.85}Ga_{0.15}As$ oxidizable layer is then exposed by shallow wet etching and oxidized for 20 minutes at 430° C. in a furnace supplied with $N_2+H_2O$ (see J. M. Dallesasse, N. Holonyak, Jr., A. R. Sugg, T. A. Richard, and N. El-Zein, Appl. Phys. Lett. 57, 2844 (1990)), resulting in the formation of ~10 μm non-oxidized stripes defining the current aperture and waveguide width. The 10 μm protective stripes ($SiN_4$) on top are removed and the samples are then lapped to ~100 μm, metallized with Au—Ge on the n-type side and Ti—Au on the p-type side. Diode samples are cleaved, the p-side clamped downward on In-coated Cu heat sinks and the diodes probe tested. For the QD reference samples (no QW), the fabrication (as above) is as described in G. Walter, N. Holonyak, Jr., J. H. Ryou, and R. D. Dupuis, Appl. Phys. Lett. 79, 3215 (2001).

Figure 9:
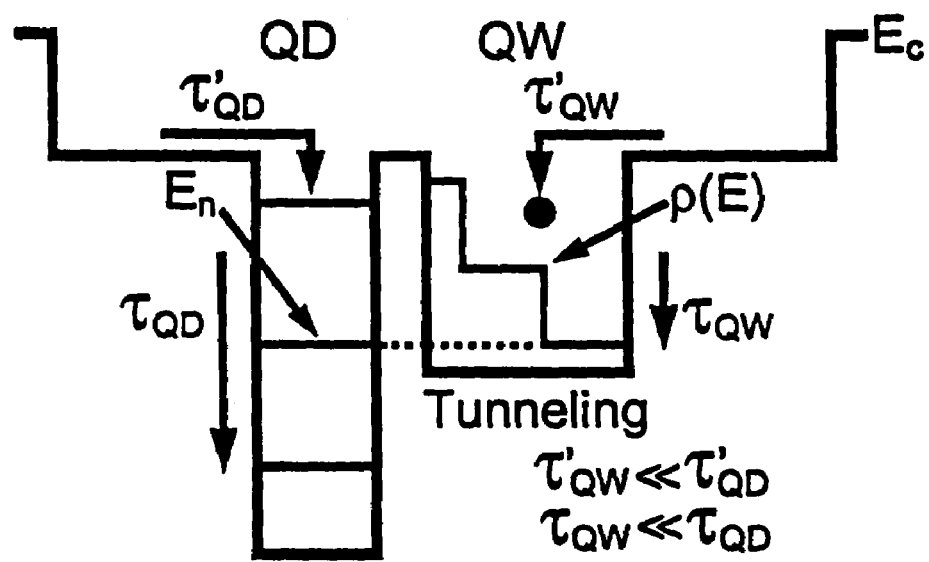
FIG. 9 is an energy diagram for a further embodiment of the invention.

A laterally continuous (x,y connected) QW is superior to QDs in terms of carrier capture time ($\tau'_{QW} << \tau'_{QD}$) and also carrier-to-ground-state relaxation time ($\tau_{QW} << \tau_{QD}$). Additionally, unlike QDs that are spatially separated, a laterally continuous QW (with only z confinement) allows carriers to redistribute efficiently laterally (e.g., to accommodate carrier "hole" burning). By coupling a QW to the QD layer as shown in FIG. 9, one can allow faster "feed" of carriers into the QDs. With faster capture time, carriers are captured predominantly by the QW and then relax quickly to the ground state of the QW, and tunnel (see S. L. Chuang and N. Holonyak, Jr., Appl. Phys. Lett. 80, 1270 (2002)) into and recombine at the QDs. The discreteness of the QD states, because of tunneling coupling, enhances the recombination behavior of the QW+QD system. Owing to the spatial separation of the QDs, enhancement of the recombination along the plane of the QW results in "preferred" recombination centers ("sweet spots") and a certain degree of mode selection. The barrier layer and its properties become design parameters in QW to QD or QD to QW recombination enhancement (as does, of course, QD and QW sizes).

Figure 10:
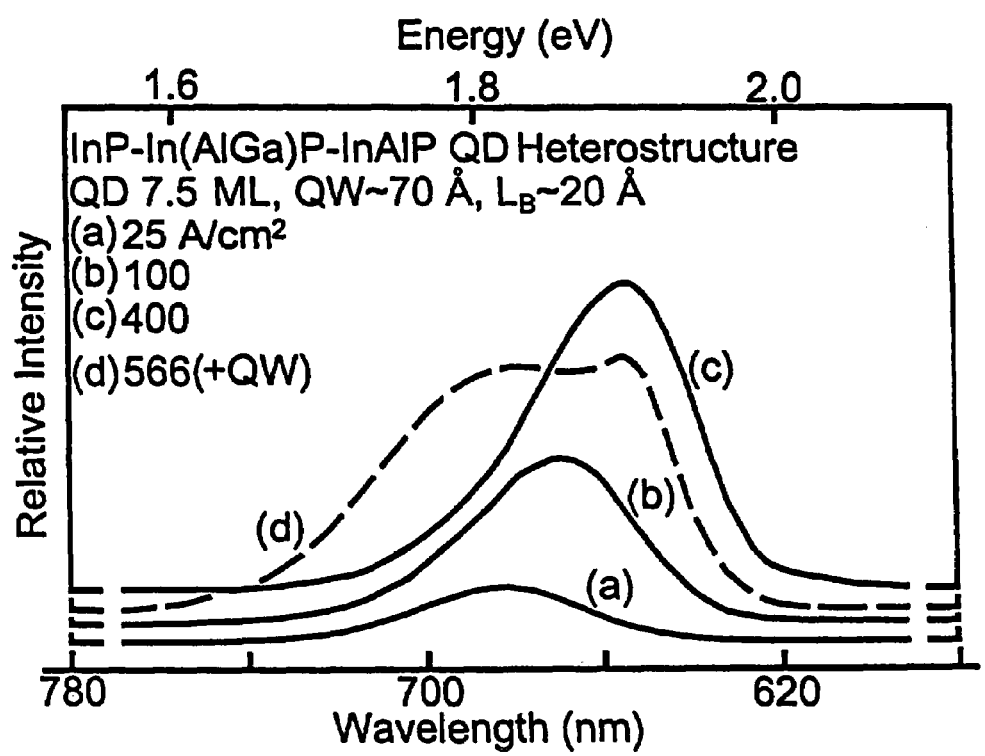
FIG. 10 shows pulse excited spectra for the further embodiment of the invention.

For comparison purposes, it is shown, in FIG. 10, the pulse excited (3% duty cycle) recombination spectra of a 400 μm long by 100 μm wide single layer 7.5 ML QD diode (no QW). Curves (a), (b) and (c) exhibit, at increasing current, the bandfilling of the QD diode, the bandfilling peak occurring at ~655 nm (n=2). The diode and photopumping characterization of similar QD+QW heterostructures confirms also the presence of collective QD states in a band at ~655 nm (see G. Walter, N. Holonyak, Jr., J. H. Ryou, and R. D. Dupuis, Appl. Pyhys. Lett. 79, 3215 (2001); J. H. Ryou, R. D. Dupuis, G. Walter, D. A. Kellogg, N. Holonyak, Jr., D. T. Mathes, R. Hull, C. V. Reddy, and V. Narayanamurti, Appl. Phys. Lett. 78, 4091 (2001); J. H. Ryou, R. D. Dupuis, G. Walter, D. A. Kellogg, N. Holonyak, Jr., D. T. Mathes, R. Hull, C. V. Reddy, and V. Narayanamurti). Curve (d), which is taken from the QD+QW diode has been added for reference to show how bandfilling advances in the two cases, i.e., QD alone vs. QW+QD which changes shape.

Figure 11:
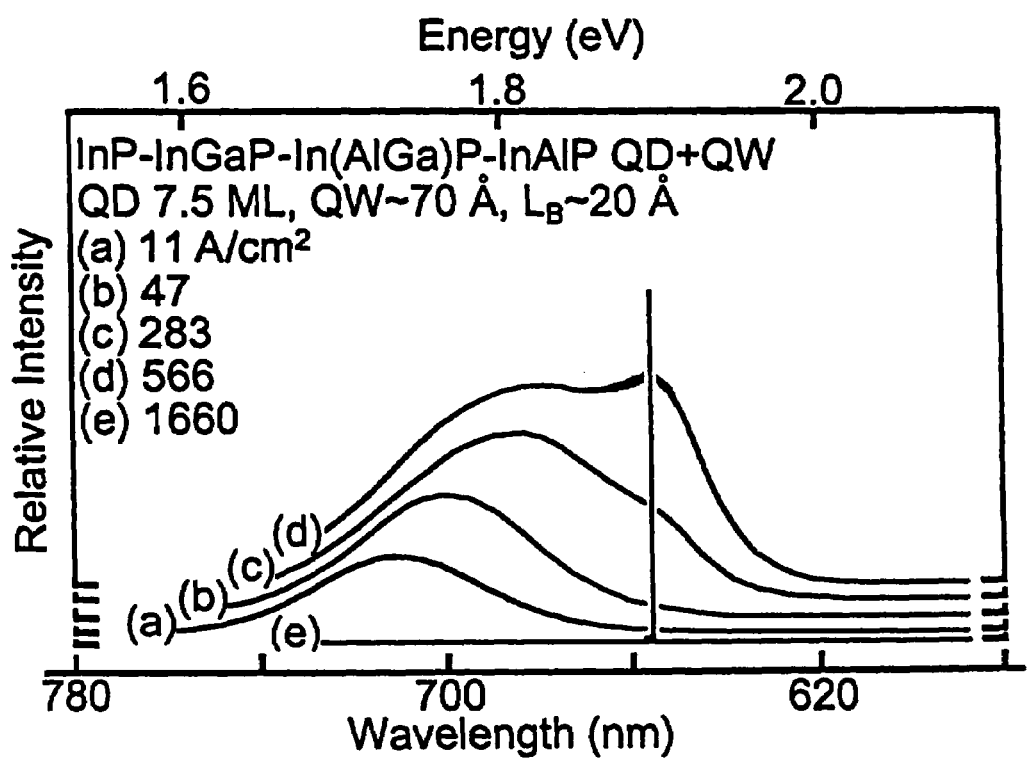
FIG. 11 shows recombination radiation spectra for the further embodiment of the invention.

FIG. 11 shows the recombination radiation spectra of a 530 μm long by 10 μm wide QD+QW laser. The 7.5 ML InP QD layer is coupled to a 70 Å InGaP QW via a 20 Å $In_{0.5}Al_{0.3}Ga_{0.2}P$ tunneling barrier. The QW is designed to have a spectral peak and QW-QD resonance enhancement at ~654 nm. By coupling the QW to an upper state of the QD rather than to a lower state, one observes more easily the QW-QD enhancement. As shown by curves (a) and (b), at lower current levels longer wavelength QD recombination radiation is evident, consistent with efficient QW carrier capture and tunneling transfer to the QDs which supports the lower energy recombination. Unlike the QD diode of FIG. 10, however, the bandfilling process tends to saturate (peak at 682 nm) and change form. At higher energy, a narrow wavelength peak emerges in the resonance region at 654 nm. The narrow spectra peak at 654 nm continues to increase with increasing current, with laser threshold occurring at 82 mA. Curve (e) shows at 99 mA onset of single mode operation for the QD+QW laser diode.

Figure 12:
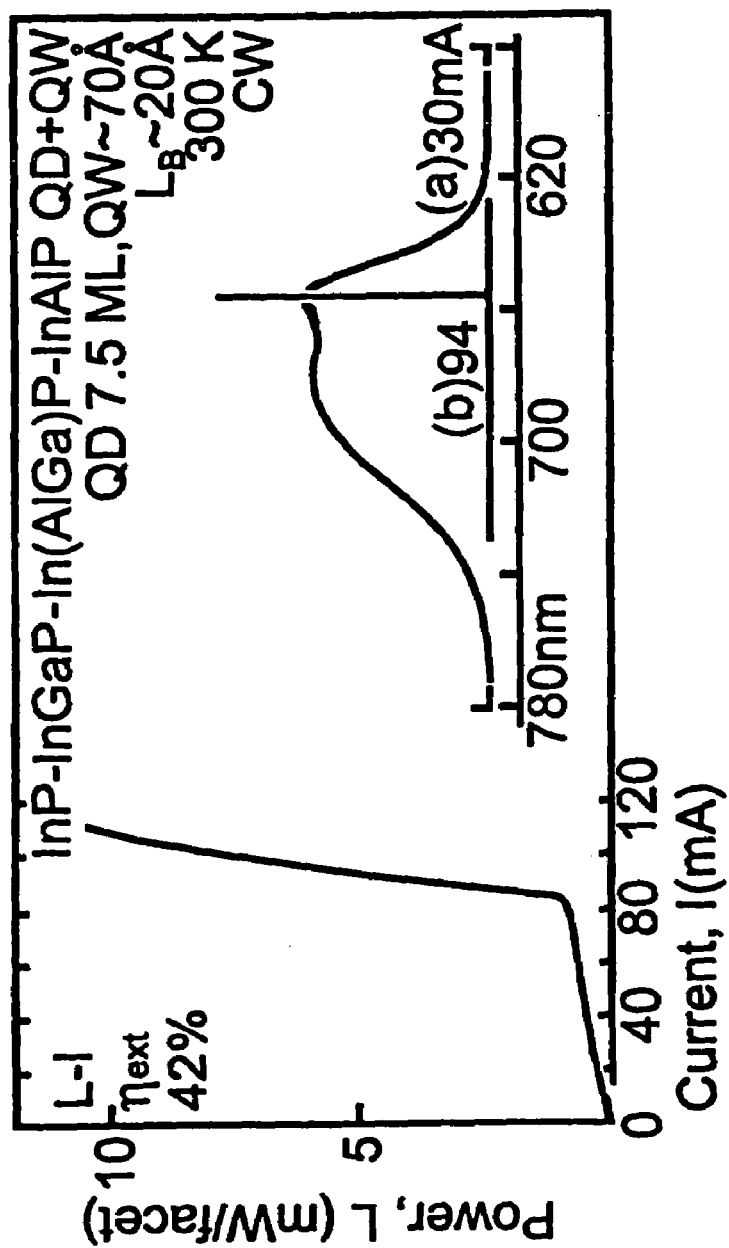
FIG. 12 shows L-I characteristics for the further embodiment of the invention.

FIG. 12 shows the L-I characteristic of the InP QD+ InGaP QW laser of the FIG. 11. The peak power of 11 mW/facet is limited by the relatively weak heating sinking. Stable single mode operation is observed from 88 mA to 94 mA. At currents exceeding 94 mA or ~2.9 mW/facet, we see another lasing mode appearing at longer wavelength, the effect of heating. The twin mode operation continues beyond 100 mA. The external quantum efficiency, $\eta_{ext}$, for the device of FIG. 12 is 42%, with a characteristic temperature of 137 K measured for operation in the temperature range of 20 to 60° C. Single mode behavior is observed also for diodes of 400 µm and 1050 µm lengths.

Figure 13:
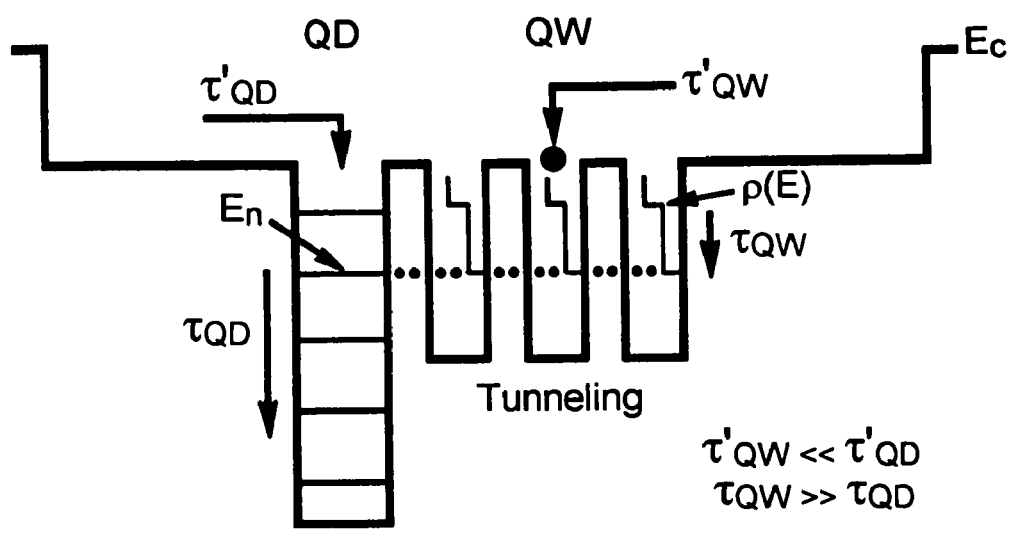
FIG. 13 is an energy diagram for another embodiment of the invention.

FIG. 13 is an energy diagram for a further embodiment of the invention which is seen to employ several quantum wells, which can be used to raise the well state energy. In this manner, higher energy states of the quantum dot layer(s) can be coupled with the multiple wells. This can advantageously permit spectral selection of the output optical radiation.

Figure 14:
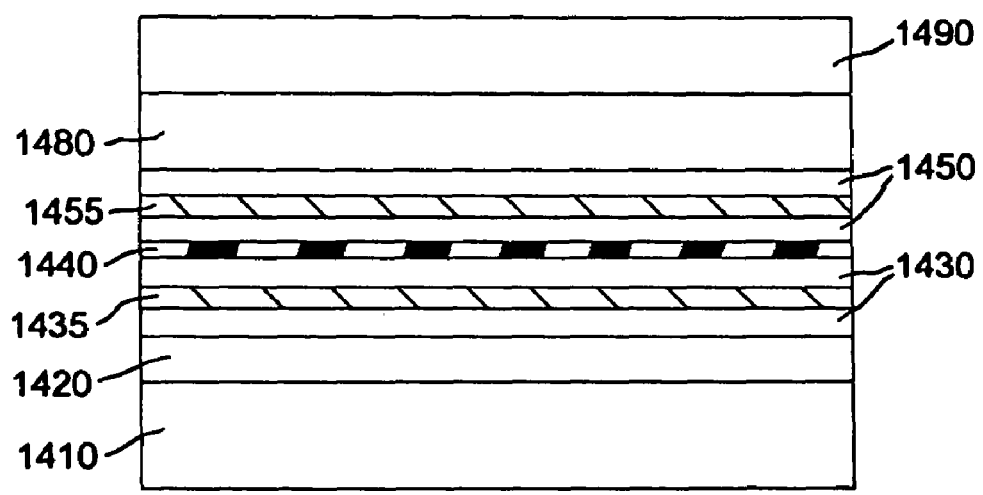
FIG. 14 is a diagram of a device in accordance with a further form of the invention.

In accordance with another form of the invention, one or more delta doped layers are used to greatly enhance the performance of a quantum dot device. In an example of this form of the invention, InP/In$_{0.5}$Al$_{0.5}$P QD samples are grown on (001) GaAs substrates 1410 (FIG. 14), by low-pressure metalorganic chemical vapor deposition (MOCVD) at ~60 Torr with H$_2$ as the carrier gas. The precursors in this example include adduct-purified trimethylindium, triethylgallium, trimethylaluminum, PH$_3$, and AsH$_3$. The growth is carried out at 650° C. by initially growing a thin undoped GaAs buffer layer 1420, followed by a 250 nm-thick unintentionally doped lattice-matched In$_{0.5}$Al$_{0.5}$P matrix layer 1430. Then, the InP QD layer 1440 with an equivalent thickness of 7.5 MLs is grown. After that, ~60 nm-thick In$_{0.5}$Al$_{0.5}$P capping layer 1450 is grown to bury the QDs. During growth, Si delta doping is symmetrically introduced in the lower and upper In$_{0.5}$Al$_{0.5}$P matrix layers with same distance d in spacing from the QD layer. The delta doped regions/layers are respectively labeled 1435 and 1455. Sheet carrier density, estimated from the uniform doping in In$_{0.5}$Al$_{0.5}$P epilayers under the same conditions, is around 1.5×10$^{11}$ cm$^{-2}$. [As before, an upper cladding layer 1480 (e.g. InAlP) and top cap layer 1490 (e.g. GaAs) can be applied for some applications, such as for applying signals via layers 1410, 1490, although layers 1480, 1490 may not be needed for cathodoluminescence experiments.] Four samples, one without the Si delta doping, and the other three with delta doping having a spacing, d, of 6, 20 and 40 nm, respectively, are examined in this example. The luminescence properties of the grown structures is characterized by cathodoluminescence (CL) over the temperature range ~300–75 K. The CL are measured at 300 K with an electron beam voltage of 8 kV and current of 600 pA.

Figure 15:
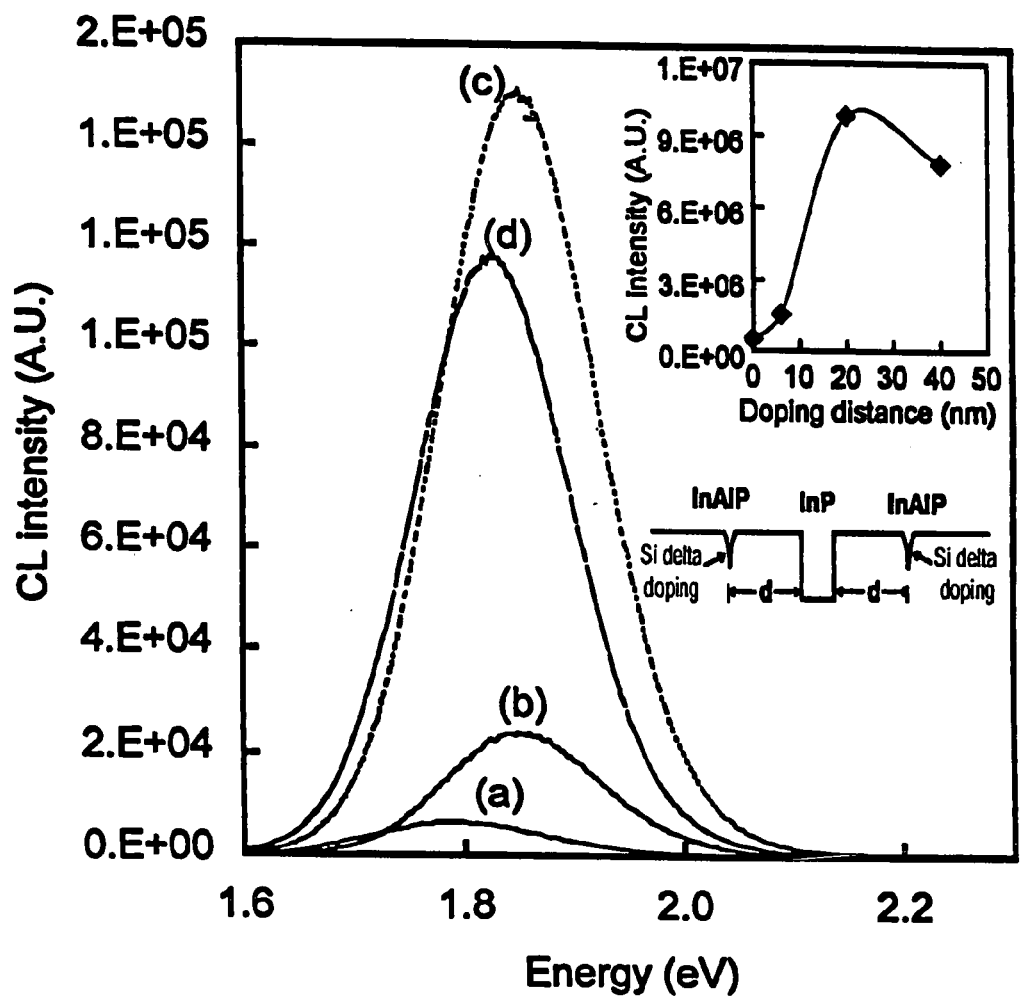
FIG. 15 shows CL spectra (300K) of InP/In$_{0.5}$Al$_{0.5}$P QDs with and without Si delta doping. Spectrum (a) is taken on a sample without Si delta doping, and (b) to (d) on samples with Si delta doping. The doping distance d, as shown in a schematic conduction band diagram in the inset, is 6, 20 and 40 nm for samples (b), (c) and (d), respectively.

The effect of Si delta doping on the CL properties of InP/In$_{0.5}$Al$_{0.5}$P QDs can be seen in FIG. 15. For comparison, a spectrum measured from a QD sample without Si delta doping is also shown [spectrum (a)]. The distance between the delta-doped Si plane and the QD layer d is 6, 20, and 40 nm for samples (b), (c), and (d), respectively. Delta doping is seen to substantially improve luminescence efficiency. As shown in the inset of the Figure, the optimized doping distance is around 20 nm, where the integrated CL intensity is ~16 times higher than that of the sample without delta doping. Si delta doping introduces a potential well and a region of high-density electrons in the region adjacent to the InP QDs. Some of these electrons are believed to be captured by the QDs. This assistance of the delta-doped layer in the capture of electrons, to some extent, counter balances the thermal escape of electrons from QDs, and may facilitate the capture of holes into the QDs, and as a result, this improves the CL efficiency. It is known that delta doping with Si also introduces a potential well in the conduction band in the doped region, the depth of the well depending on the sheet carrier density and the doping (see, for example, see E. F. Schubert, "*Delta-doping of Semiconductors*", Cambridge University Press, 1996. When the Si plane is too close to the QD layer, this potential well will overlap with the QD potential and as a result it lowers the confining potential, and the CL efficiency will not be very high. On the other hand, when the Si doping plane is too far away from the QD layer, the difficulty for electrons to be captured into the QDs will be increased. Thus, there will be an optimized distance, which is about 20 nm in this example. With an increase in distance d, the CL spectra shows a blue shift when the CL intensity increases (i.e. from (a) to (c)), and a red shift when the CL intensity decreases (i.e. from (c) to (d)). This blue shift is possibly due to the state-filling effect. The state-filling effect depends on the population of carriers in the energetically lower states in QDs and this population depends on the efficiency of capturing electrons from the reservoir of the delta-doping layer. With an increase in the doping distance, an increase in the capture efficiency and a blue shift of CL would be expected. While the distance increases to above the optimized one, a decrease in capture efficiency and a red-shift of CL would be expected.

Figure 16:
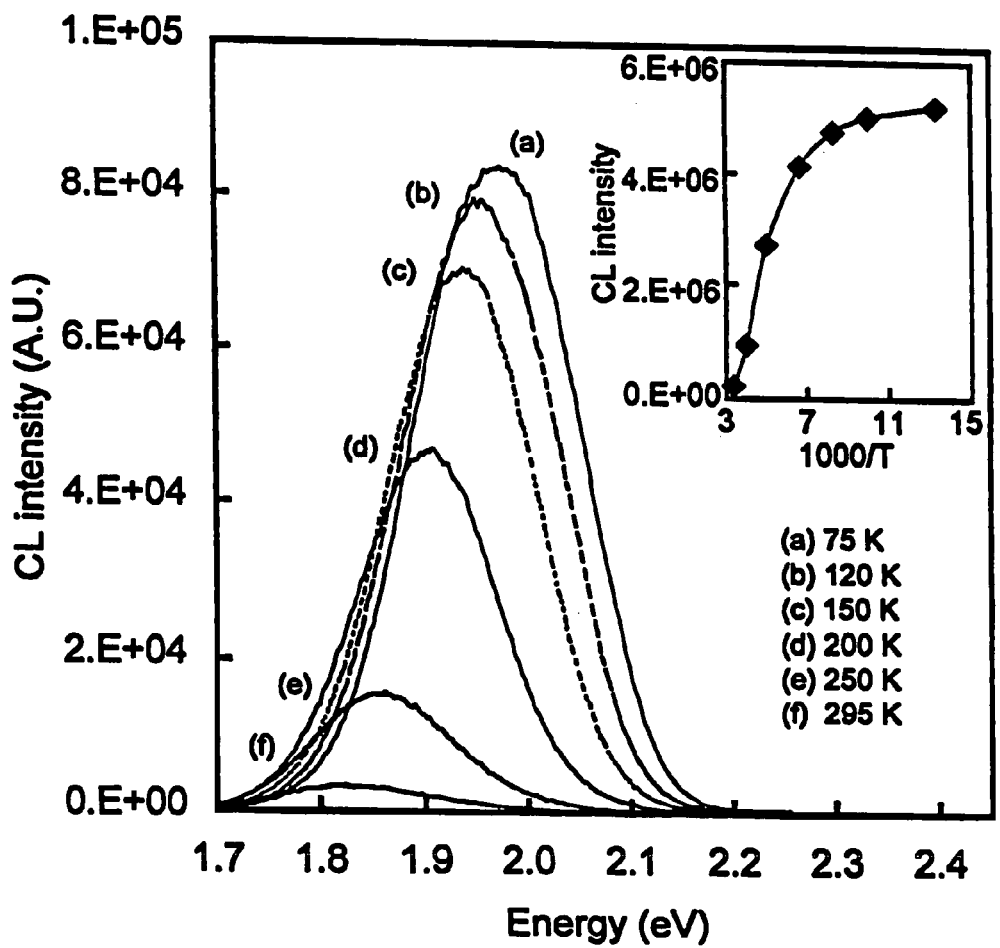
FIG. 16 shows temperature-dependent CL spectra of the QD sample without Si delta doping. The temperature for each spectrum is indicated.

Further evidence of thermal escape of electrons from QDs and capture of electrons from the reservoir of delta-doping layer in our QD samples is seen from the temperature-dependent CL performance. FIG. 16 shows the temperature-dependent CL spectra of InP QDs without Si delta doping. A decrease in CL intensity with an increase in temperature is observed. The inset of the figure shows an Arrhenius plot of the integrated CL intensity as a function of 1000/T, where T is the temperature. The thermal quenching at high temperatures can be fitted well with an activation energy of ~150 meV. This value is much smaller than the energy difference between the bandgap of In$_{0.5}$Al$_{0.5}$P and the CL peak energy (~0.43 eV) and is very close to the difference in conduction band energies, (The energy difference between the conduction band of In$_{0.5}$Al$_{0.5}$P and the electron transition state of QDs is about 190 meV when the band offset is 0.43 eV and the offset ratio is 43/57. Considering the fact that the confinement energy is larger for electrons than for holes, the real energy difference will be less than 190 meV.) This suggests that unipolar escape of electrons from the QDs is the most likely mechanism responsible for the thermal quenching of the CL at high temperatures. (See S. Weber, W. Limmer, K. Thonke, R. Sauer, K. Panzlaff, G. Bacher, H. P. Meier, and P. Roentgen, Phys. Rev. B 52, 14739 (1995); M. Gurioli, J. Martinez-Pastor, M. Colocci, C. Deparis, B. Chastaingt, and J. Massies, Phys. Rev. B 46, 6922 (1992).) Accompanying the quenching of the total CL emission, it can be noted that the CL intensity of the lower energy tail does, in fact, increase with the temperature up to ~200 K. Furthermore, the CL peak shows a large red shift. The total red shift amounts to 160 meV within the temperature range of 75–295 K, and is significantly larger than the variation in the InP bandgap within the studied temperature range (see W. J. Turner, W. E. Reese, and G. D. Pettit, Phys. Rev. 136, A1467 (1964)). These two features strongly indicate (1) a difference in activation energy between QDs of different size, and (2) a thermally activated transfer of excited carriers from small QDs to large QDs. This transfer is responsible for the increase in the intensity of CL of large QDs. (See X. B. Zhang, K. L. Ha, and S. K. Hark, J. Electron. Mater. 30, 1332 (2001); L. Brusaferri, S. Sanguinetti, E. Grilli, M. Guzzi, A. Bignazzi, F. Bogani, L. Carraresi, M. Colocci, A. Bosacchi, P. Frigeri, and S. Franchi, Appl. Phys. Lett. 69, 3354, (1996).)

Figure 17:
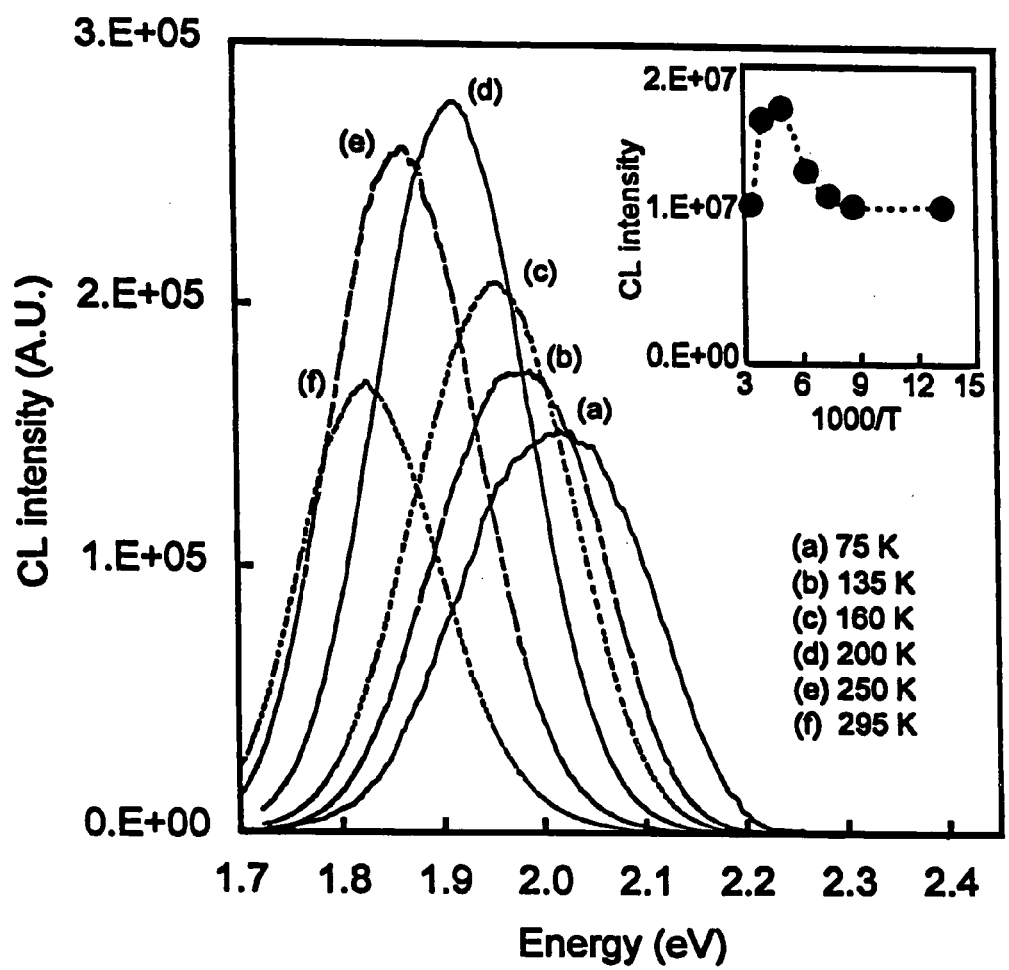
FIG. 17 shows temperature-dependent CL spectra of a QD sample with Si delta doping. The doping distance d is 40 nm.

FIG. 17 shows the typical temperature-dependent CL spectra of an InP QD sample with delta doping whose doping distance d is 40 nm. It is seen that unlike the spectra displayed in FIG. 16, the CL intensity in the measured temperature range is of the same order of magnitude. The inset of the Figure is a plot of the integrated CL intensity versus 1000/T. With an increase in temperature, the CL intensity increases first, then decreases after reaching a maximum around 200 K. The strongest peak at 200 K is about 1.7 times stronger than that at 75 K. Moreover, the integrated CL intensity at 300K is still a little bit higher than that at 75 K. It is thought that this unusual behavior is caused by carrier dynamical competition between two processes: (1) thermal activation of carriers out of the potential well introduced by delta doping and then captured by QDs, which leads to an increase in CL intensity; and (2) quenching of the CL due to thermal activation of carriers out of the QDs. At low temperatures ($\leq$~90 K), the electrons are mostly frozen in the Si plane. In this case, the delta doping has negligible effect on the optical properties of InP QDs. The temperature-dependent CL spectra of the two samples with and without delta doping should have similar behaviors and their integrated CL intensity should be of the same value. At intermediate temperatures (~135 K to ~200 K), the frozen out electrons in the Si plane will be removed. Some electrons will be thermally activated out of the well and captured by nearby QDs. However, since the confining barrier of the QDs in this temperature region is much larger than the thermal energy, kT, the rate for thermal activation of electrons out of the QDs is very small. A net enhancement in the capture of electrons into the QDs and an increase in CL intensity with temperature are expected. At high temperatures, thermal activation of electrons out of QDs dominates the capture process. The electrons will have less chance to stay in QDs for radiative recombination and a quenching of CL with an increase in temperature is expected.

According, it has been demonstrated that introducing Si delta-doped layers in the vicinity of InP QDs in the $In_{0.5}Al_{0.5}P$ barrier during the MOCVD growth can effectively improve the luminescence efficiency. This increase in CL efficiency is due to more efficient capture of electrons into the QDs from the reservoir of the delta-doping layer, which, to some extent, balances the thermal escape of electrons from QDs. Temperature-dependent CL study of QD sample without Si delta doping shows a quenching of the CL at high temperature with an activation energy of 150 meV, supporting the unipolar thermal escape of electrons from QDs. On the other hand, the CL of samples with delta doping shows an increase in integrated intensity with temperature until about 200 K. This anomalous increase in CL intensity is interpreted as caused by a competition between two processes: (1) thermal activation of carriers out of the potential well introduced by delta doping and then captured by QDs, which enhances the CL intensity; (2) quenching of CL due to thermal activation of carriers out of the QDs.

The invention has been described with reference to particular preferred embodiments, but variations within the spirit and scope of the invention will occur to those skilled in the art, for example, techniques and devices which employ both one or more quantum well and/or delta doped layers in conjunction with one or more layers of quantum dots and/or doped dots.

The invention claimed is:

1. A semiconductor device, comprising:
   a plurality of semiconductor layers;
   means for coupling signals to and/or from layers of said device;
   a layer of quantum dots disposed between adjacent layers of said device; and
   a delta doped layer disposed in one of said adjacent layers, and spaced from said layer of quantum dots, said delta doped layer being operative to communicate carriers with said layer of quantum dots.

2. The device as defined by claim 1, wherein said plurality of semiconductor layers are III–V semiconductor.

3. The device as defined by claim 2, further comprising a further delta doped layer, said delta doped layers being spaced from said quantum dot layer on opposing sides thereof.

4. The device as defined by claim 3, wherein said delta doped layers are at spacings from said quantum dot layer in the range about 5 nm to 50 nm.

5. The device as defined by claim 2, wherein said delta doped layer is doped to a concentration of at least about $N=10^{18}/cm^3$.

6. The device as defined by claim 5, wherein said delta doped layer is spaced from said quantum dot layer by a spacing in the range about 5 nm to 50 nm.

7. The device as defined by claim 6, wherein said layer of quantum dots comprises a layer of InP quantum dots.

8. The device as defined by claim 7, wherein said delta doped layer comprises a layer doped with silicon dopant.

9. The device as defined by claim 2, wherein said delta doped layer is spaced from said quantum dot layer by a spacing in the range about 5 nm to 50 nm.

10. The device as defined by claim 2, wherein said device is a light emitting device.

11. The device as defined by claim 1, further comprising a further delta doped layer, said delta doped layers being spaced from said quantum dot layer on opposing sides thereof.

12. The device as defined by claim 11, wherein said delta doped layers are at spacings from said quantum dot layer in the range about 5 nm to 50 nm.

13. The device as defined by claim 1 wherein said delta doped layer is doped to a concentration of at least about $N=10^{18}/cm^3$.

14. The device as defined by claim 13, wherein said delta doped layer is spaced from said quantum dot layer by a spacing in the range about 5 nm to 50 nm.

15. The device as defined by claim 14, wherein said layer of quantum dots comprises a layer of InP quantum dots.

16. The device as defined by claim 15, wherein said delta doped layer comprises a layer doped with silicon dopant.

17. The device as defined by claim 1, wherein said delta doped layer is spaced from said quantum dot layer by a spacing in the range about 5 nm to 50 nm.

18. The device as defined by claim 1, wherein said device is a light emitting device.

* * * * *